United States Patent
Takeuchi et al.

[11] Patent Number: 5,812,574
[45] Date of Patent: Sep. 22, 1998

[54] QUANTUM OPTICAL SEMICONDUCTOR DEVICE PRODUCING OUTPUT OPTICAL EMISSION WITH SHARPLY DEFINED SPECTRUM

[75] Inventors: Atsushi Takeuchi; Yoshiaki Nakata, both of Kawasaki, Japan

[73] Assignee: Fujitsu Limited, Kawasaki, Japan

[21] Appl. No.: 896,653

[22] Filed: Jul. 18, 1997

Related U.S. Application Data

[63] Continuation of Ser. No. 528,096, Sep. 14, 1995, abandoned.

[30] Foreign Application Priority Data

Dec. 19, 1994 [JP] Japan .................................. 6-314378

[51] Int. Cl.$^6$ ................................ H01S 3/19; H01S 3/08
[52] U.S. Cl. ................................ 372/45; 372/96
[58] Field of Search ................................ 372/45, 96, 44, 372/43; 359/248

[56] References Cited

U.S. PATENT DOCUMENTS

| | | | |
|---|---|---|---|
| 4,802,181 | 1/1989 | Iwata | 372/45 |
| 5,073,893 | 12/1991 | Kondou | 372/45 |
| 5,138,625 | 8/1992 | Paoli et al. | 372/45 |
| 5,499,206 | 3/1996 | Muto | 365/114 |

FOREIGN PATENT DOCUMENTS

| | | | |
|---|---|---|---|
| 3-283479 | 12/1991 | Japan | 372/43 |
| 5-343800 | 12/1993 | Japan | 372/45 |
| 6-188493 | 7/1994 | Japan | 372/9 |

OTHER PUBLICATIONS

Hecht, *Understanding Lasers: An Entry–Level Guide*, pp. 280–281, no month avail 1994.

Miyake et al., "Room–Temperature Operation of GaInAs/GaInAsP/InP SCH Lasers with Quantum–Wire Size Active Region", IEEE Journal of Quantum Electronics(vol. 29, No. 6), pp. 2123–2133, Jun. 1993.

*Primary Examiner*—Rodney B. Bovernick
*Assistant Examiner*—Luong-Quyen T. Phan
*Attorney, Agent, or Firm*—Staas & Halsey

[57] ABSTRACT

An optical semiconductor device includes a plurality of quantum structures in an active layer thereof, wherein each of the quantum structures is confined in at least two of the three, mutually perpendicular dimensions, and wherein at least two of the quantum structures are separated with a distance that allows tunneling of carriers therebetween.

12 Claims, 9 Drawing Sheets

QUANTUM OPTICAL SEMICONDUCTOR DEVICE PRODUCING OUTPUT OPTICAL EMISSION WITH SHARPLY DEFINED SPECTRUM

This application is a continuation of application Ser. No. 08/528,096, filed Sep. 14, 1995, now abandoned.

BACKGROUND OF THE INVENTION

The present invention generally relates to optical semiconductor devices and more particularly to an optical semiconductor device such as light emitting diode or laser diode.

Optical semiconductor devices of various types, such as light emitting diode, laser diode, planar laser diode, and the like, are used widely in the field of optical telecommunications, audio-visual applications, various sensing technologies, optical interconnections of integrated circuits, and the like. Thus, intensive efforts are being made on such optical semiconductor devices for improving various characteristics thereof.

Conventionally, optical semiconductor devices, including light emitting diodes and laser diodes, have been fabricated using a bulk crystal of a compound semiconductor material.

FIG. 1 shows an example of such a conventional optical semiconductor device, wherein the illustrated example of FIG. 1 is a planar laser diode that emits an optical beam generally perpendicularly to the epitaxial layers formed therein.

Referring to FIG. 1, the laser diode is constructed upon an n-type GaAs substrate 1 and includes a first cladding layer 2 of the n-type formed on the substrate 1, wherein the cladding layer 2 includes therein a multi-layer mirror structure. On the cladding layer 2, a spacer layer 3 of n-type AlGaAs is provided, and an active layer 4 of an InGaAs/GaAs quantum well structure is provided on the spacer layer 3.

On the active layer 4, a spacer layer 5 of p-type AlGaAs is formed, and a second cladding layer 6 of the p-type is provided further on the spacer layer 5, wherein the second cladding layer 6 includes a multi-layer mirror structure, similarly to the first cladding layer 2. Further, a cap layer 7 of p-type GaAs is provided on the cladding layer 6, and an insulation film 8 covers the surface of grooves 7A and 7B, wherein the grooves 7A and 7B form a current confinement structure at both sides of a mesa structure 7C. It should be noted that each of the grooves 7A and 7B reach the active layer 4, and the insulation film 8 covers only the grooves 7A and 7B.

Further, an ohmic electrode 9 of the AuZn/Au structure is formed on the cap layer 7 as a p-type ohmic electrode such that the electrode 9 fills the grooves 7A and 7B. Similarly, an n-type ohmic electrode 10 of the AuGe/Au structure is provided on the lower major surface of the substrate 1, wherein the electrode 10 is formed with a window that exposes the substrate 1, and an anti-reflection film 11 is provided on such an exposed surface of the substrate 1.

In operation, the electrons and holes injected into the active layer 4 respectively from the electrodes 10 and 9 cause a recombination therein to emit photons. The photons thus emitted are then reflected back and forth between the cladding layers 2 and 6 forming multi-layer mirrors, and there occurs an optical amplification in the active layer 4 as a result of stimulated emission as indicated by an arrow. The coherent optical beam thus produced as a result of such a stimulated emission is finally emitted after passing through the anti-reflection film 11.

The structure of FIG. 1 may be formed by an MBE process or MOCVD process in which a GaAs/AlGaAs stacking structure is deposited on the substrate 1 repeatedly for 22.5 times to form the cladding layer 2, followed by the deposition of the spacer layer 3 on the cladding layer 2. On the spacer layer 3, a GaAs layer forming the barrier layer of the quantum well structure is deposited with a thickness of 10 nm, followed by the deposition of an InGaAs layer forming the quantum well layer with a thickness of 8 nm. Further, another barrier layer of GaAs is deposited on the InGaAs quantum well layer with a thickness of 10 nm.

After the quantum well structure forming the active layer 4 is formed as such, the deposition of the spacer layer 5 of the p-type AlGaAs is made thereupon, followed by the formation of the upper cladding layer 6, wherein the formation of the upper cladding layer 6 is made by repeating the deposition of a p-type GaAs/AlAs structure for 25 times with the deposition of an intervening spacer layer of $Al_{0.5}Ga_{0.5}As$ having a thickness of 20 nm, to form the multi-layer mirror structure in the cladding layer 6.

Further, the deposition of the cap layer 7 is made on the cladding layer 6, followed by a mesa etching process, conducted in an etching solution of $Br:HBr:H_2O_2$, to form the mesa structure 7C defined laterally by the grooves 7A and 7B. After the formation of the mesa structure as such, the deposition of the $SiO_2$ film 8 is made on the surface of the grooves 7A and 7B, followed by the deposition of the ohmic electrode 9. Further, the other ohmic electrode 10 is deposited on the lower major surface of the substrate 1, followed by the formation of a window therein in correspondence to the mesa structure 7C. Further, an SiN film is deposited on the exposed surface of the substrate 1 as the anti-reflection film 11.

FIGS. 2A and 2B show the energy spectrum of carriers indicating the relationship between the density of state of carriers and the energy in an active layer, for the case in which the active layer is formed of a bulk crystal, as well as for the case in which the active layer formed of a quantum well, wherein FIG. 2A shows the relationship for the bulk crystal while FIG. 2B shows the relationship for the quantum well.

As will be understood clearly from FIG. 2A, the bulk crystal allows a substantial range or width of energy spectrum for the carriers filling the energy band as indicated by hatching in FIG. 2A, while the range of the allowable energy spectrum is substantially confined in the quantum well structure as indicated in FIG. 2B. In relation to the energy spectra of FIGS. 2A and 2B, a laser diode using such a bulk crystal for the active layer generally shows a substantial broadening of oscillation spectrum, while such a broadening of the oscillation spectrum is substantially suppressed by using a quantum well structure for the active layer.

In order to narrow the oscillation spectrum further and to achieve a still higher efficiency of laser oscillation, use of quantum wires or quantum boxes are studied intensively for the active layer of laser diode.

FIGS. 3A and 3B show the energy spectrum of carriers for a quantum wire and a quantum box respectively, wherein it will be noted that use of such a quantum wire shown in FIG. 3A substantially reduces the broadening of the energy spectrum for the carriers and hence the optical spectrum of the laser oscillation, as compared with the conventional quantum well structure shown in FIG. 2B. Particularly, the use of a quantum box substantially eliminates the width from the energy spectrum as indicated in FIG. 3B, and the width of the oscillation spectrum of the laser diode becomes minimum in the laser diode that uses such a quantum box structure for the active layer.

On the other hand, the process technology for forming such a quantum wire or quantum box is not yet established in contrast to the case of forming a quantum well structure, and associated with this, there arises a problem that the size of the individual quantum wire or quantum box variates substantially. When this is the case, such a variation in the size of the individual quantum wire or quantum box induces an apparent variation in the oscillation spectrum of the laser diode, even when each of the quantum structures produces an optical beam with a sharply defined spectrum, as indicated in FIGS. 4A and 4B, wherein FIG. 4A shows the case of a quantum wire while FIG. 4B shows the case of a quantum box.

Referring to FIG. 4A, it will be noted that there exist a plurality of quantum wires having respective sizes and hence respective, sharply defined energy spectra, which, however, collectively form a broadened overall spectrum for the laser diode, as indicated by the envelop.

The same situation occurs also in the quantum box of FIG. 4B. In FIG. 4B, it will be noted that there exist a plurality of quantum boxes having respective sizes and hence respective, sharply defined energy spectra, which, however, collectively form a broadened overall energy spectrum for the laser diode as indicated by the envelop.

FIGS. 4A and 4B indicate that, because of the variation in the size of the quantum wire or quantum box, the laser diode that uses such a quantum structure for the active layer of the device generally shows a widely spread spectrum of laser oscillation rather than the desired sharply confined one.

SUMMARY OF THE INVENTION

Accordingly, it is a general object of the present invention to provide a novel and useful optical semiconductor device wherein the foregoing problems are eliminated.

Another and more specific object of the present invention is to provide a quantum optical semiconductor device that emits an optical beam with a reduced width of spectrum and with a high efficiency.

Another object of the present invention is to provide an optical semiconductor device, comprising:

a first cladding layer of a first conductivity type;

an active layer formed on said first cladding layer;

a second cladding layer of a second, opposite conductivity type;

first electrode means provided on said first cladding layer; and second electrode means provided on said second cladding layer;

said active layer including a plurality of quantum structures each confined in at least two of the three, mutually perpendicular dimensions;

wherein at least two of said quantum structures are separated with a distance that allows tunneling of carriers therebetween.

According to the present invention, the carriers in the quantum structure having a higher energy level can escape to the quantum structure having a lower energy level by tunneling through a barrier layer intervening the quantum structures. Thereby, the carriers are ultimately accumulated in the quantum structure having the lowest energy level, and the photon emission or laser oscillation occurs selectively at the wavelength corresponding to such a lowest energy level, with high efficiency and with a sharply defined optical spectrum. The quantum structure may be a quantum wire in which carriers are confined in two of the three dimensions or a quantum box in which carriers are confined in all of the three dimensions. It should be noted that the laser diode of the present embodiment is capable of oscillating at a wavelength of 1.28 μm while using low cost substrate of GaAs in place of expensive InP substrate used conventionally.

Other objects and further features of the present invention will become apparent from the following detailed description when read in conjunction with the attached drawings.

DETAILED DESCRIPTION OF THE PREFERRED EMBODIMENTS

Figure 5A:
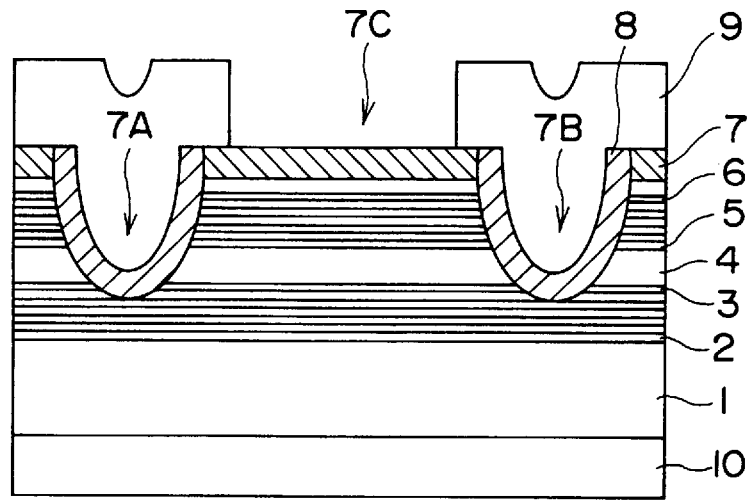
FIGS. 5A and 5B are diagrams showing the construction of a planar laser diode according to a first embodiment of the present invention.

FIG. 5A shows the construction of a planar laser diode according to a first embodiment of the present invention, wherein those parts corresponding to the parts described previously are designated by the same reference numerals and the description thereof will be omitted.

Figure 1:
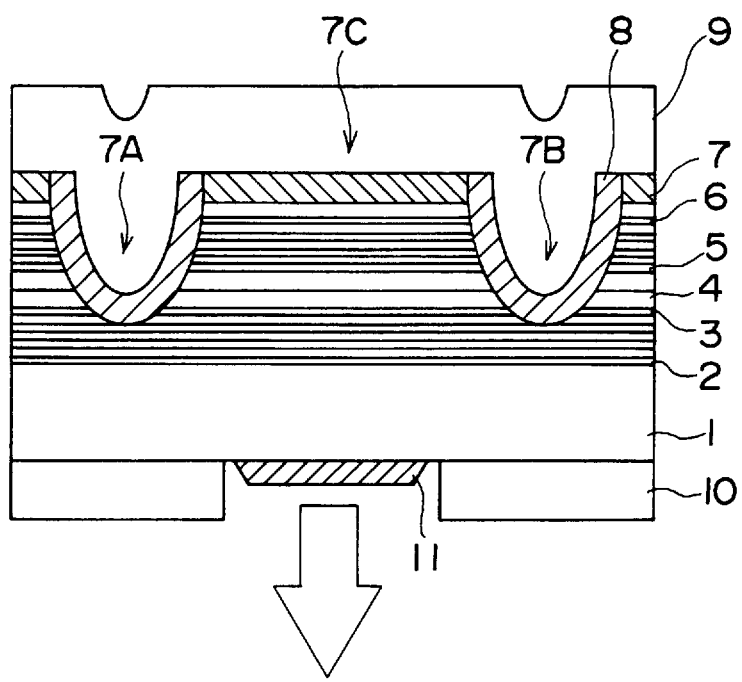
FIG. 1 is a diagram showing the construction of a conventional planar laser diode.
Figure 2A:
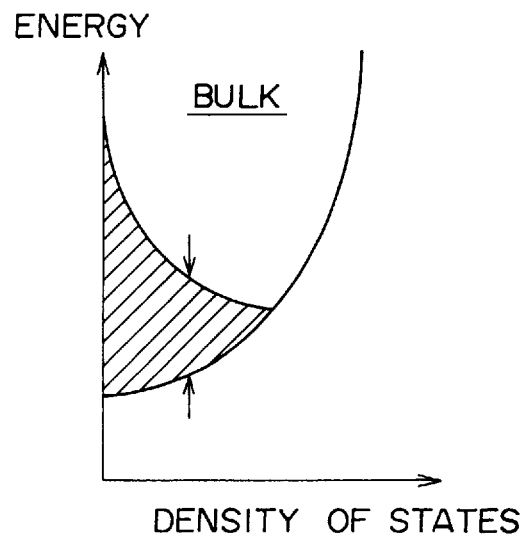
FIGS. 2A and 2B are diagrams showing the relationship between energy and density of states respectively for a bulk crystal and a quantum well.
Figure 2B:
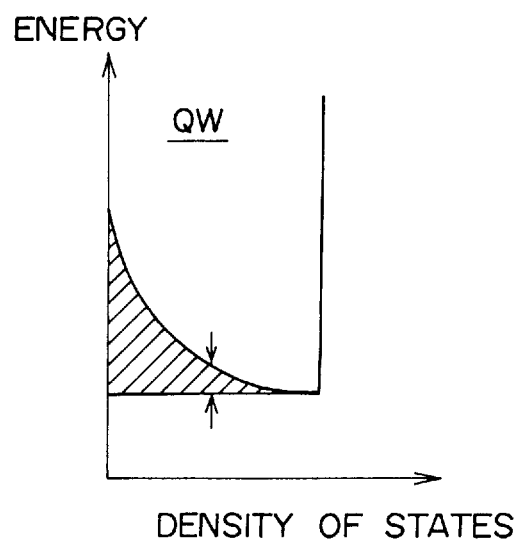
Figure 5B:
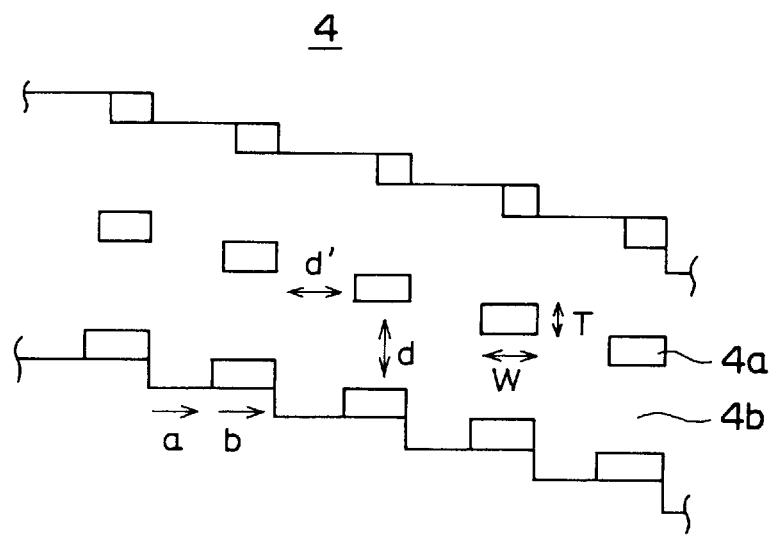

In FIG. 5A, it will be noted that the laser diode has a structure similar to that of the conventional laser diode of FIG. 1, except that the active layer 4 is formed of quantum wires as indicated in FIG. 5B.

Referring to FIG. 5B, the active layer 4 includes a plurality of quantum wires 4a each extending vertically to the plane of FIG. 5B, wherein each quantum wire 4a is formed of undoped GaAs and has a lateral size W in a first direction and a thickness T in a second direction, wherein the sizes W and T are set smaller than the de Broglie wavelength of the carriers such that there appear discrete quantum levels in the quantum wires 4a. The quantum wires 4a are separated from each other in the active layer 4 by a barrier layer 4b of undoped AlGaAs, and the barrier layer 4b forms a potential well that confines the carriers in the quantum wires 4a.

Generally, the quantum wires 4a shown in FIG. 5B are formed in the active layer by carrying out a two-dimensional growth of a GaAs layer on a stepped surface of the underlying cladding layer 2, wherein the stepped surface is obtained by using a so-called off-angle substrate in which the principal surface of the substrate is inclined with respect to the (100) surface with a predetermined angle of 1°–2°. By carrying a two-dimensional growth of an undoped AlGaAs layer from a step edge as indicated in FIG. 5B by an arrow a, followed by a further two-dimensional growth of an undoped GaAs layer as indicated by an arrow b, and by repeating such a process a number of times, one obtains the desired quantum wire structure shown in FIG. 5B.

Figure 4A:
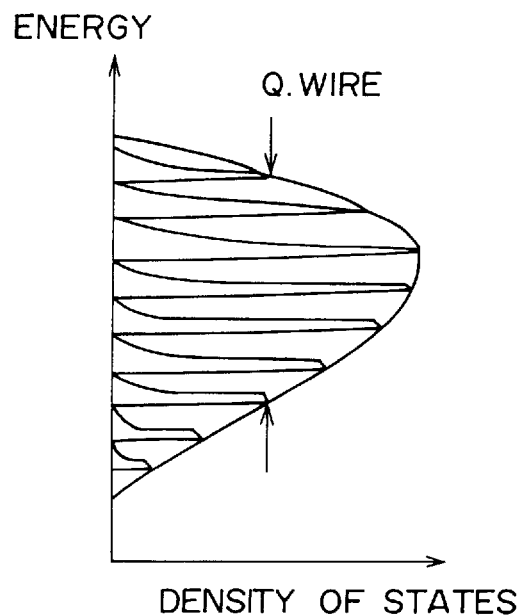
FIGS. 4A and 4B are diagrams explaining the problem of broadening of laser spectrum respectively in a conventional laser diode that uses quantum wires and in a conventional laser diode that uses quantum boxes.
Figure 4B:
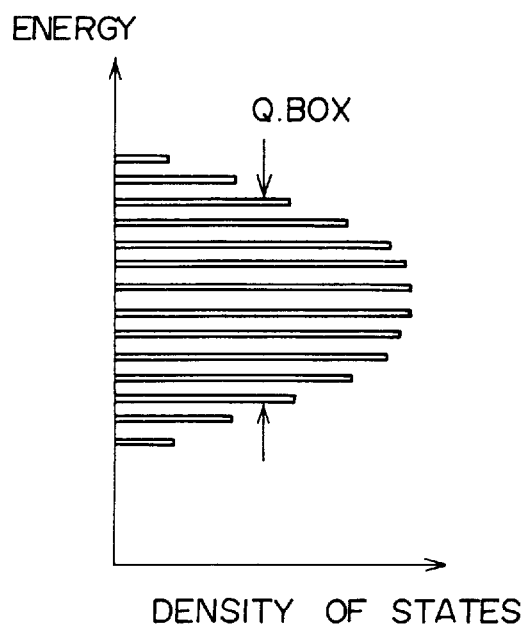

In such a fabrication process, there is a tendency that the size W and the thickness T of the quantum wire 4a change variously due to the difficulty in controlling such a two-dimensional crystal growth exactly. As a result, there is a tendency that the size of the quantum well wires 4a changes variously within the same active layer 4, and the problem of broadening of the optical spectrum described with reference to FIG. 4A appears.

In order to eliminate the problem of broadening of the optical spectrum, the laser diode of the present embodiment reduces the distance d or d' between the quantum wires 4a, such that electrons and holes in a quantum wire can easily escape to another quantum wire having a lower quantum level. Typically, the distance d or d' is set smaller than 10 nm.

Figure 6A:
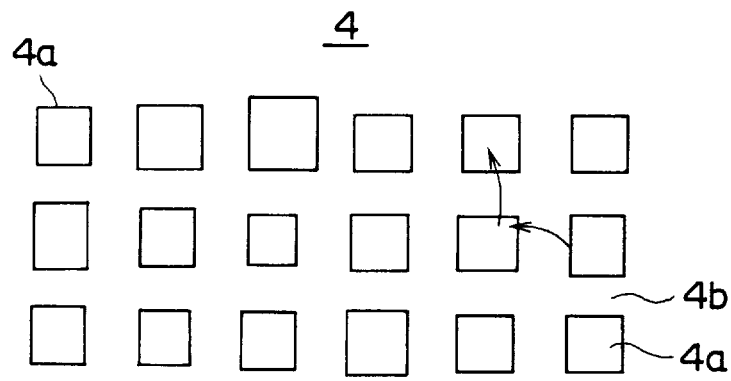
FIGS. 6A–6C are diagrams explaining the principle of the laser diode of the first embodiment.

FIG. 6A shows such a "hopping" of the carriers between the quantum wires 4a schematically.

Referring to FIG. 6A, there are formed quantum wires 4a of various sizes, wherein the carriers cause a hopping from a quantum wire 4a to an adjacent quantum wire 4a of a larger size and hence of a lower quantum level, as a result of tunneling through the barrier layer 4b of AlGaAs.

Figure 6B:
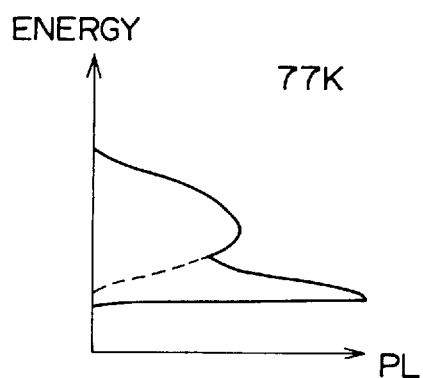

Referring to FIG. 6B showing the photo luminescence spectrum of the laser diode measured at 77K where the thermal excitation of the carriers is not significant, it will be noted that the photo luminescence occurs not only in the quantum wire 4a of the lowest energy level but also in other quantum wires, resulting in a widely spread energy spectrum. At such a low temperature, the tunneling of the carriers through the barrier layer 4b is retarded substantially due to the absence of thermal excitation of the carriers.

Figure 6C:
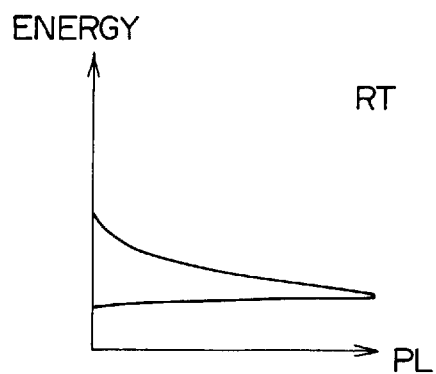

FIG. 6C shows the same photo luminescence spectrum observed at the room temperature environment. At the room temperature, the tunneling of the carriers through the barrier layer 4b is substantially facilitated by the thermal excitation, and the carries are quickly accumulated to the quantum well 4b of the lowest energy level after repeating the hopping. As a result, a sharply defined photo luminescent spectrum having a substantially reduced half-height width is obtained for the laser diode. In other words, the laser diode of the present embodiment produces an output optical beam with a sharply defined optical spectrum. Associated therewith, the efficiency of laser oscillation is improved substantially.

In the laser diode of the present embodiment, it should be noted that one may also employ InGaAs for the quantum wire 4a and InAlAs for the barrier layer 4b.

Next, a second embodiment of the present invention will be described with reference to FIGS. 7A and 7B, wherein those parts identical to the parts described previously are designated by the same reference numerals and the description thereof will be omitted.

Figure 3A:
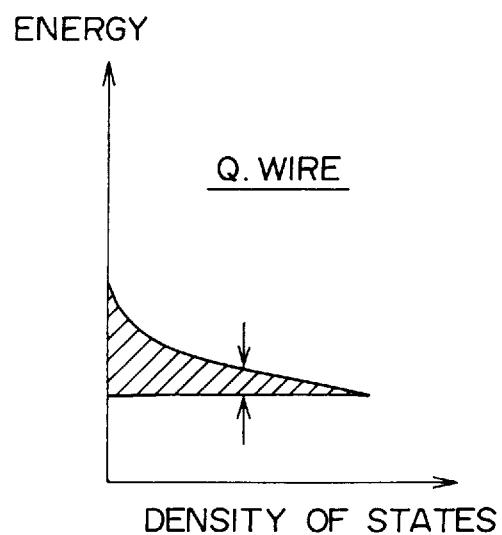
FIGS. 3A and 3B are diagrams showing the relationship between energy and density of states respectively for a quantum wire and a quantum box.
Figure 3B:
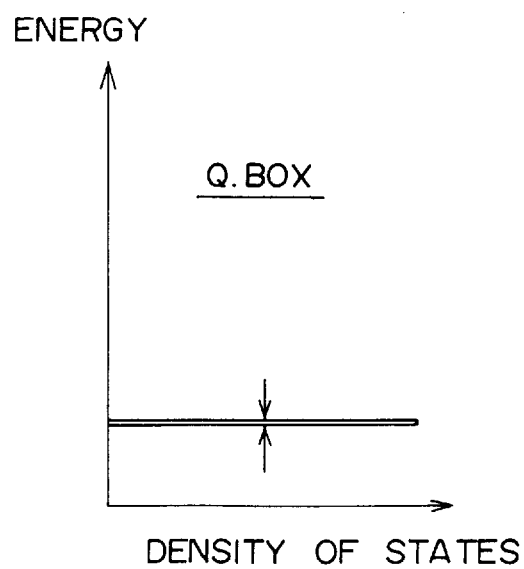
Figure 7A:
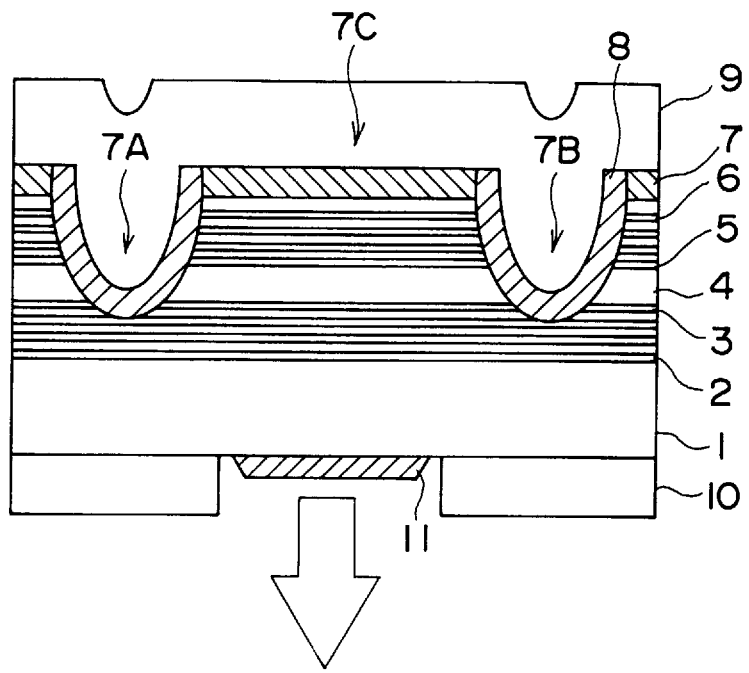
FIGS. 7A and 7B are diagrams showing the construction of a planar laser diode according to a second embodiment of the present invention.
Figure 7B:
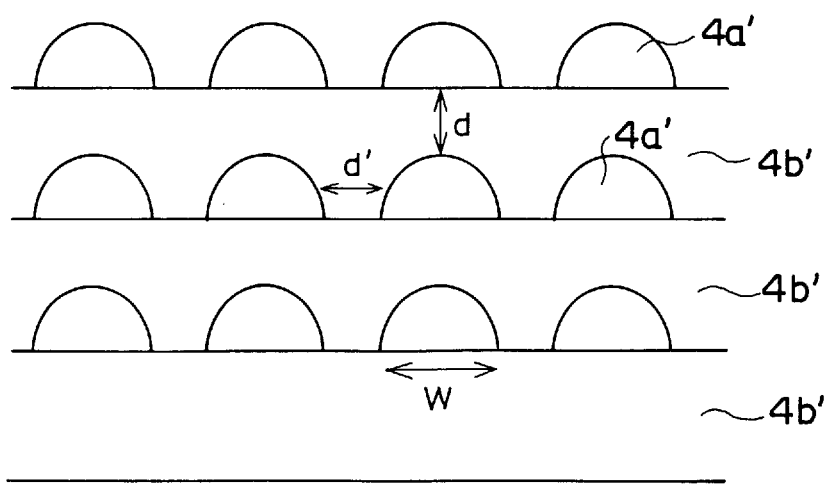

Referring to FIG. 7A, the laser diode has a structure identical to the structure of FIG. 1 except that the active layer 4 now includes a number of quantum boxes 4a' dispersed in a barrier layer 4b' as indicated in FIG. 7B, wherein the quantum box 4a' is formed of an InGaAs island having a lateral size of several ten to several hundred atomic layers and a thickness of several atomic layers. The quantum boxes 4a' are confined three-dimensionally by the barrier layer 4b' of GaAs and provides the energy spectrum as indicated in FIG. 3B. In the illustrated example of FIG. 7B, it will be noted that a plurality of the barrier layers 4b', each including therein the quantum boxes 4a' in the form of island structure, are stacked with each other.

Figure 8A:
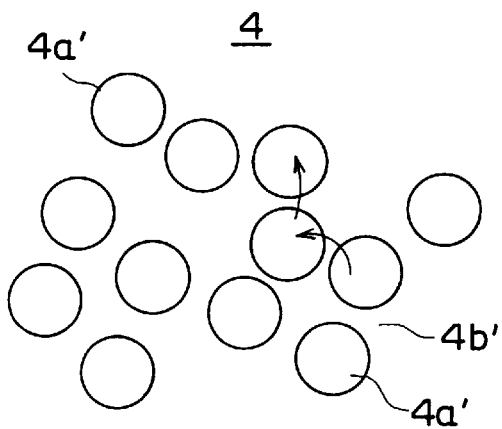
FIGS. 8A–8C are diagrams explaining the principle of the laser diode of the second embodiment.

In the present embodiment, it should be noted that the quantum boxes 4a' are separated from each other with a distance d or d' that allows tunneling of carriers between the quantum boxes 4a' through the barrier layer 4b' as indicated in FIG. 7B. More specifically, there exists at least one quantum box adjacent to an arbitrary quantum box 4a' within a tunnel distance of the carriers. Thereby, the carriers in a quantum box 4a' having a higher energy level escape to another quantum box 4a' as indicated by arrows in a schematical diagram of FIG. 8A. Ultimately, the carriers are accumulated in a quantum box having the lowest energy level, after hopping from one quantum box to another by tunneling. It should be noted that, in the structure of FIG. 7B, the size W of the quantum box may change variously and hence the energy level thereof.

The fabrication process of the active layer 4 of FIG. 7B may be conducted as follows.

First, the GaAs layer 4b' is deposited on the spacer layer 3 of n-type AlGaAs, followed by a deposition of an InAs layer with a thickness of 2.5 atomic layers. Thereby, the InAs layer thus deposited forms an island structure on the GaAs layer 4b' due to the lattice misfit between InAs and GaAs, wherein the islands of InAs thus formed are converted to InGaAs forming the quantum boxes 4a' as a result of reaction between InAs in the island and GaAs in the layer 4b'. The islands of InGaAs are then buried under another GaAs layer 4b' to form the desired quantum box 4a' embedded in a barrier layer of widegap material. As already noted, such a barrier layer 4b' including therein the quantum boxes 4a' are stacked repeatedly to form the active layer 4.

Figure 8B:
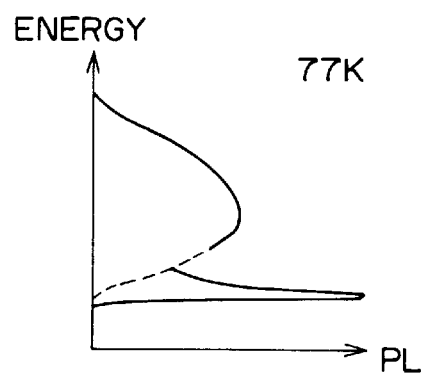

FIG. 8B shows the photo luminescent spectrum of the laser diode of the second embodiment observed at a low temperature of 77K. At such a low temperature, the thermal excitation of carriers is suppressed substantially and the tunneling of carriers through the barrier layer 4b' is retarded. Thereby, the output of the laser diode becomes a mere superposition of the optical emission from each of the quantum boxes 4a' in the active layer 4, and there appears a widely spread optical spectrum as indicated in FIG. 8B.

Figure 8C:
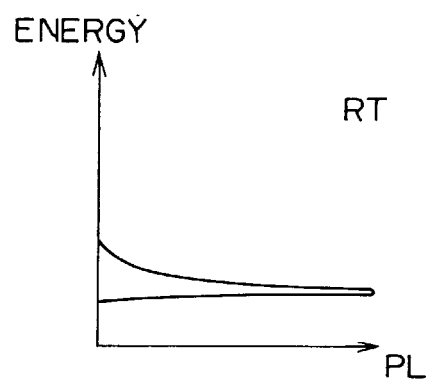

On the other hand, FIG. 8C shows the same photo luminescent spectrum measured at the room temperature. At the room temperature, the hopping of the carriers between the quantum boxes 4a' by tunneling through the barrier layer 4b' is substantially facilitated. Thus, the carriers are settled in the quantum box or quantum boxes having the lowest energy level, and one observes a very sharp optical spectrum in the optical beam emitted from the laser diode. It should be noted that the laser diode of the present embodiment is capable of oscillating at a wavelength of 1.28 µm while using low cost substrate of GaAs in place of conventionally used InP substrate.

Figure 9A:
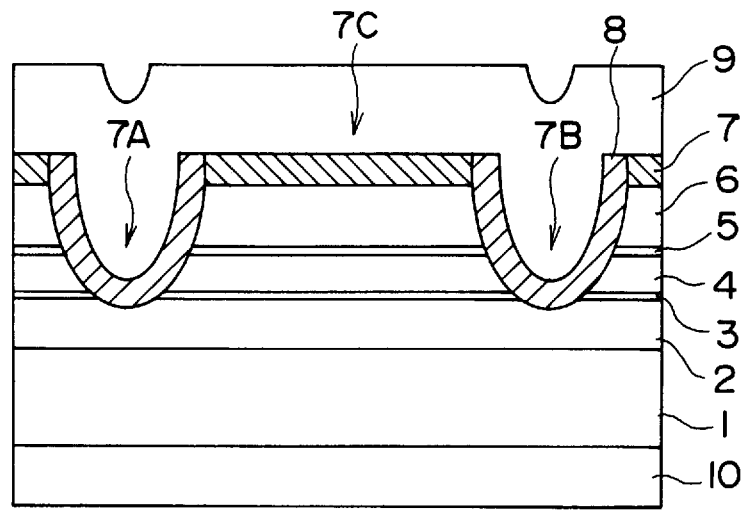
FIGS. 9A and 9B are diagrams showing the laser diode according to a third embodiment of the present invention.
Figure 9B:
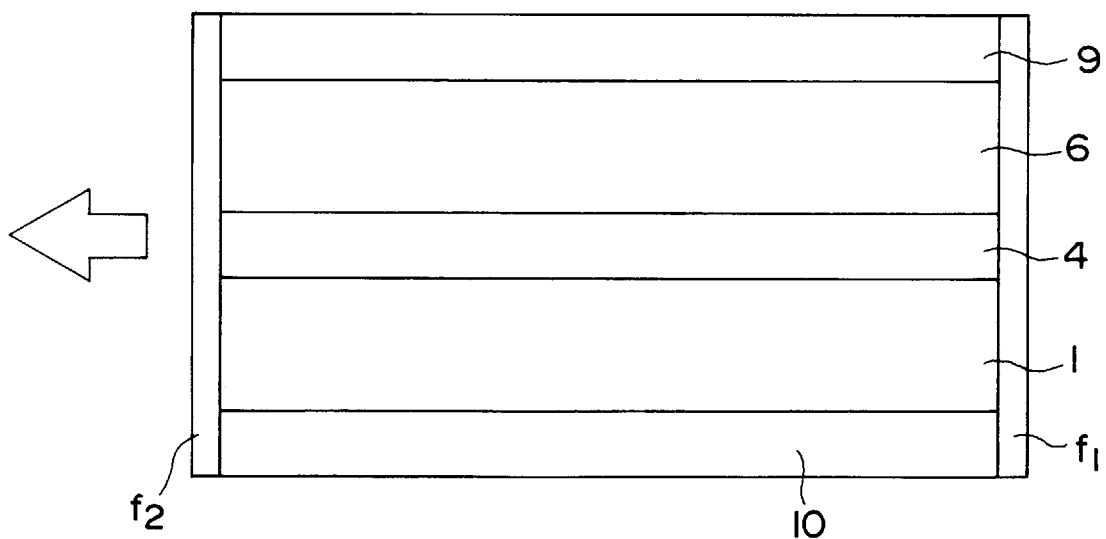

FIGS. 9A and 9B show a third embodiment of the present invention showing an edge emission type laser diode respectively in an end view and in a longitudinal cross sectional view. In FIGS. 9A and 9B, those parts corresponding to the parts described previously are designated by the same reference numerals and the description thereof will be omitted.

Referring to FIGS. 9A and 9B, the laser diode has a construction similar to that of the device of the first or second embodiment, except that the cladding layers 2 and 6 are free from the multi-layer mirror structure and that no optical windows are formed on the ohmic electrode 9 or 10. Instead, the device of the third embodiment carries a mirror $f_1$ as a first end surface and a corresponding anti-reflection film $f_2$ on an opposing second edge surface, as indicated in FIG. 9B. In FIG. 9B, it should be noted that the illustration of the spacer layers 3 and 5 as well as the illustration of the grooves 7A and 7B are omitted for the sake of simplicity.

In the device of the present embodiment, the active layer 4 may have any of the quantum structures shown in FIGS. 5B and 7B. Thereby, the injected carriers cause a hopping from one quantum wire or box to another quantum wire or box and ultimately settle in the quantum wire or box having the lowest energy state. Upon incidence of photon, the carriers thus accumulated cause a stimulated emission, and the optical beam thus formed is reflected back and forth between the foregoing first and second end surfaces. Further, the optical beam is emitted from the second end surface as indicated in FIG. 9B by an arrow.

Further, one can construct a light emitting diode by merely eliminating the mirror $f_1$ from the structure of FIGS. 9A and 9B, while using the quantum structure of FIG. 5B or 7B for the active layer 4.

Further, the present invention is not limited to the embodiments described heretofore, but various variations and modifications may be made without departing from the scope of the invention.

What is claimed is:

1. An optical semiconductor device, comprising:
   a first cladding layer of a first conductivity type;
   an active layer formed on said first cladding layer;
   a second cladding layer of a second, opposite conductivity type;
   a first electrode provided on said first cladding layer; and
   a second electrode provided on said second cladding layer;
   said active layer including a plurality of quantum structures each confined in at least two of three, mutually perpendicular dimensions;
   said plurality of quantum structures having respective sizes that collectively provide a substantially continuous distribution of quantum levels;
   wherein at least two of said quantum structures are separated with a distance through which carriers tunnel therebetween such that an escape of electrons and holes from a first quantum structure to a second quantum structure having a lower quantum level occurs at a rate sufficient to cause an accumulation of the electrons and holes in a quantum structure having a lowest energy.

2. An optical semiconductor device as claimed in claim 1, wherein each of said quantum structures forms a quantum wire confined in two of the three dimensions and extending in the direction of the remaining dimension.

3. An optical semiconductor device as claimed in claim 2, wherein said quantum wire comprises GaAs embedded in a barrier layer of AlGaAs.

4. An optical semiconductor device as claimed in claim 2, wherein said quantum wire comprises InGaAs embedded in a barrier layer of InAlAs.

5. An optical semiconductor device as claimed in claim 1, wherein each of said quantum structures forms a quantum box confined in all of the three dimensions.

6. An optical semiconductor device as claimed in claim 5, wherein said quantum box comprises InGaAs forming an island structure in a barrier layer of GaAs.

7. An optical semiconductor device as claimed in claim 1, wherein said quantum structures are separated from each other within a distance of 10 nm.

8. An optical semiconductor device as claimed in claim 1, wherein said first electrode includes an opening for optically exposing said active layer, and wherein each of said first and second cladding layers includes a multi-layer mirror therein.

9. An optical semiconductor device as claimed in claim 1, wherein said second electrode includes an opening for optically exposing said active layer, and wherein each of said first and second cladding layers includes a multi-layer mirror therein.

10. An optical semiconductor device as claimed in claim 1, wherein said active layer is defined by first and second, mutually opposing end surfaces, and wherein one of said first and second end surfaces carries a reflector thereon.

11. A method of producing an optical beam by a laser diode, said laser diode comprising:
    a first cladding layer of a first conductivity type;
    an active layer formed on said first cladding layer;
    a second cladding layer of a second, opposite conductivity type;
    a first electrode provided on said first cladding layer; and
    a second electrode provided on said second cladding layer;
    said active layer including a plurality of quantum structures each confined in at least two of three, mutually perpendicular dimensions;
    said plurality of quantum structures having respective sizes that collectively provide a substantially continuous distribution of quantum levels, at least two of said quantum structures being separated with a distance through which carriers tunnel therebetween such that an escape of electrons and holes from a first quantum structure to a second quantum structure having a lower quantum level occurs at a rate sufficient to cause an accumulation of said electrons and holes in a quantum structure having a lowest energy, said method comprising the steps of:
    holding said laser diode in a room temperature environment; and
    injecting electrons and holes to said active layer via said first and second electrodes.

12. A method as claimed in claim 11, wherein said room temperature environment is substantially higher than 77K.

* * * * *

UNITED STATES PATENT AND TRADEMARK OFFICE
CERTIFICATE OF CORRECTION

PATENT NO.: 5,812,574
DATED : September 22, 1998
INVENTOR(S): Atsushi TAKEUCHI et al.

It is certified that error appears in the above-identified patent and that said Letters Patent is hereby corrected as shown below:

On the Title Page, Under [56] U.S. Patent Documents, insert the following references :

| | | |
|---|---|---|
| 5,175,739 | 12/92 | Takeuchi et al. |
| 5,187,715 | 2/93 | Weisbuch et al. |
| 5,200,969 | 4/93 | Paoli |
| 5,307,200 | 4/94 | Yoshida |
| 5,430,309 | 7/95 | Ugajin |
| 5,495,115 | 2/96 | Kudo et al. |
| 5,530,713 | 6/96 | Fukagai |

Signed and Sealed this

Twenty-third Day of March, 1999

Attest:

Q. TODD DICKINSON

*Attesting Officer*    *Acting Commissioner of Patents and Trademarks*